(12) United States Patent
Sugaya (10) Patent No.: US 11,658,641 B2
(45) Date of Patent: *May 23, 2023

(54) HIGH-FREQUENCY MODULE

(71) Applicant: Murata Manufacturing Co., Ltd., Nagaokakyo (JP)

(72) Inventor: Yukiteru Sugaya, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 155 days.

This patent is subject to a terminal disclaimer.

(21) Appl. No.: 17/068,871

(22) Filed: Oct. 13, 2020

(65) Prior Publication Data

US 2021/0028767 A1    Jan. 28, 2021

Related U.S. Application Data

(63) Continuation of application No. 16/008,077, filed on Jun. 14, 2018, now Pat. No. 10,848,129, which is a (Continued)

(30) Foreign Application Priority Data

Dec. 25, 2015    (JP) .............................. JP2015-255395

(51) Int. Cl.
*H03H 9/64*    (2006.01)
*H03H 9/05*    (2006.01)
(Continued)

(52) U.S. Cl.
CPC ........ *H03H 9/6489* (2013.01); *H03H 9/0009* (2013.01); *H03H 9/02913* (2013.01); (Continued)

(58) Field of Classification Search
CPC ............... H03H 9/6489; H03H 9/0009; H03H 9/02913; H03H 9/0557; H03H 9/059; (Continued)

(56) References Cited

U.S. PATENT DOCUMENTS

| 5,920,142 A | * | 7/1999 | Onishi | ................. | H03H 9/0509 |
| | | | | | 310/313 R |
| 10,340,883 B2 | * | 7/2019 | Sugaya | ................ | H03H 9/6483 |
| 10,848,129 B2 | * | 11/2020 | Sugaya | .................. | H03H 9/059 |

OTHER PUBLICATIONS

Sugaya, "High-Frequency Module", U.S. Appl. No. 16/008,077, filed Jun. 14, 2018.

* cited by examiner

*Primary Examiner* — Rakesh B Patel
*Assistant Examiner* — Jorge L Salazar, Jr.
(74) *Attorney, Agent, or Firm* — Keating & Bennett, LLP (57) ABSTRACT

A high-frequency module includes a module substrate including an internal wiring pattern, and a SAW filter including a piezoelectric substrate, an electrode pattern on the piezoelectric substrate, a support surrounding the electrode pattern, and a cover on the support covering the electrode pattern to define a hollow space together with the support and the piezoelectric substrate. The module substrate, the cover, and the piezoelectric substrate are disposed in this order in a perpendicular or substantially perpendicular direction with respect to the module substrate, and a shield electrode is provided on a surface of the cover that faces the module substrate or on a surface of the cover that faces the piezoelectric substrate.

16 Claims, 6 Drawing Sheets

Related U.S. Application Data continuation of application No. PCT/JP2016/088325, filed on Dec. 22, 2016.

(51) Int. Cl.
*H03H 9/10* (2006.01)
*H03H 9/02* (2006.01)
*H03H 9/25* (2006.01)
*H03H 9/00* (2006.01)
*H03H 9/145* (2006.01)

(52) U.S. Cl.
CPC .......... *H03H 9/059* (2013.01); *H03H 9/0557* (2013.01); *H03H 9/1064* (2013.01); *H03H 9/1092* (2013.01); *H03H 9/14597* (2013.01); *H03H 9/25* (2013.01); *H03H 9/6483* (2013.01)

(58) Field of Classification Search
CPC ............... H03H 9/1064; H03H 9/1092; H03H 9/14597; H03H 9/25; H03H 9/6483; H03H 9/1071
USPC .......................................... 333/133, 193–196
See application file for complete search history.

HIGH-FREQUENCY MODULE

CROSS REFERENCE TO RELATED APPLICATIONS

This application claims the benefit of priority to Japanese Patent Application No. 2015-255395 filed on Dec. 25, 2015 and is a Continuation Application of PCT Application No. PCT/JP2016/088325 filed on Dec. 22, 2016. The entire contents of each application are hereby incorporated herein by reference.

BACKGROUND OF THE INVENTION

1. Field of the Invention

The present invention relates to a high-frequency module that includes a surface acoustic wave filter.

2. Description of the Related Art

In the related art, a surface acoustic wave filter has been widely used as, for example, a band-pass filter that is disposed in a front-end section of a mobile communication device. In addition, a multiplexer that includes a plurality of surface acoustic wave filters has been used in order to accommodate multifunctionality, such as multi-mode/multi-band. Such a surface acoustic wave filter is required to pass a high-frequency signal within a pass band with a low loss and to reject a high-frequency signal outside the pass band with high attenuation.

Figure 6:
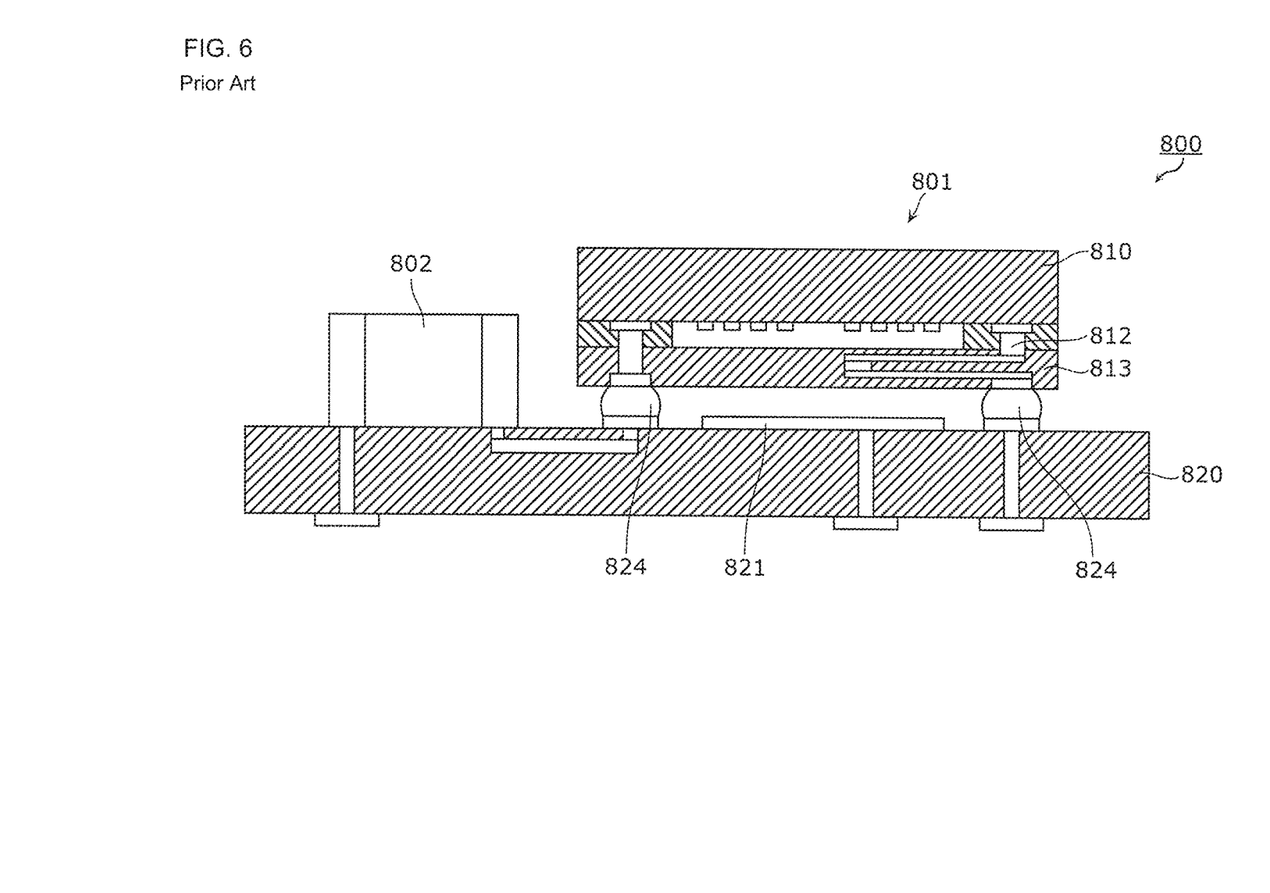
FIG. 6 is a diagram illustrating a sectional structure of a high-frequency module described in Japanese Patent No. 5510613.

Japanese Patent No. 5510613 discloses a configuration of a circuit module that includes a duplexer. FIG. 6 is a diagram illustrating the sectional structure of the circuit module described in Japanese Patent No. 5510613. A circuit module 800 illustrated in FIG. 6 includes a multilayer substrate 820, a duplexer 801 that includes a transmission surface acoustic wave filter and a reception surface acoustic wave filter, and a chip coil 802. The duplexer 801 has a WLP (Wafer Level Package) filter structure and includes a filter substrate 810, a cover layer 813, and connecting electrodes 812. Interdigital transducer (IDT) electrodes are formed on a surface of the filter substrate 810, and the duplexer 801 is flip-chip bonded to the multilayer substrate 820 via bumps 824 such that the surface of the filter substrate 810 faces a mounting surface of the multilayer substrate 820. A shield electrode 821 is provided on the mounting surface of the multilayer substrate 820 and electrically connected to a ground wiring line. The shield electrode 821 is able to prevent the transmission surface acoustic wave filter and the reception surface acoustic wave filter of the duplexer 801 from being coupled with and mutually interfering with the chip coil 802 and an internal wiring pattern, which is embedded in the multilayer substrate 820.

However, in the case of the circuit module described in Japanese Patent No. 5510613, the shield electrode 821 is disposed on the multilayer substrate 820. Electrode patterns other than the shield electrode 821 need to be disposed at other places. Consequently, there is a problem in that the area required to provide the electrode patterns other than the shield electrode 821 on the multilayer substrate 820 increases, such that the circuit module cannot be reduced in size.

SUMMARY OF THE INVENTION

Preferred embodiments of the present invention provide high-frequency modules that are each reduced in size while mutual interference between a surface acoustic wave filter and a peripheral wiring pattern of the high-frequency modules is reduced or prevented.

A high-frequency module according to a preferred embodiment of the present invention includes a module substrate that includes an internal wiring pattern and a surface acoustic wave filter that is disposed on the module substrate. The surface acoustic wave filter includes a piezoelectric substrate, an electrode pattern that is provided on the piezoelectric substrate, a support that is provided on a surface of the piezoelectric substrate so as to surround the electrode pattern, and a cover that is provided on the support and that covers the electrode pattern so as to define a hollow space together with the support and the piezoelectric substrate. The module substrate, the cover, and the piezoelectric substrate are arranged in this order in a perpendicular or substantially perpendicular direction with respect to the module substrate, and a shield electrode that is grounded is provided in or on a surface of the cover that faces the module substrate or is provided in or on a surface of the cover that faces the piezoelectric substrate.

As a result, the shield electrode is disposed between the electrode pattern of the wafer level package (WLP) surface acoustic wave filter and the internal wiring pattern provided in the module substrate, and thus, undesirable mutual interference between the surface acoustic wave filter and the internal wiring pattern is able to be reduced or prevented. In addition, it is not necessary to provide a shield electrode to reduce or prevent mutual interference in or on the module substrate, and thus, the area of the module substrate 30 is reduced. Therefore, the high-frequency module is able to be reduced in size.

The shield electrode may overlap at least a portion of the electrode pattern when the module substrate is viewed in plan view.

As a result, undesirable mutual interference between the portion of the electrode pattern and the internal wiring pattern provided in the module substrate is more effectively reduced or prevented.

The shield electrode may overlap a region in which a first internal wiring pattern of the module substrate and the electrode pattern overlap each other when the module substrate is viewed in plan view.

As a result, the shield electrode is disposed in the region in which the electrode pattern and the first internal wiring pattern overlap each other when viewed in plan view, and thus, undesirable mutual interference between the electrode pattern and the first internal wiring pattern is reduced or prevented with high precision.

The first internal wiring pattern may be connected to the electrode pattern and is an inductor that is connected to a parallel resonator of the surface acoustic wave filter and to a ground terminal, and the shield electrode may reduce or prevent inductive coupling, capacitive coupling, or inductive coupling and capacitive coupling between the first internal wiring pattern and the electrode pattern.

The first internal wiring pattern connected to the parallel resonator generates an attenuation pole outside a pass band by defining a resonance circuit with a resonator. When the first internal wiring pattern is coupled to the electrode pattern, the generation of the attenuation pole may sometimes be inhibited. In contrast, by disposing the shield electrode between the electrode pattern and the first internal wiring pattern, degradation of the attenuation characteristics outside the pass band is reduced or prevented.

A high-frequency module according to a preferred embodiment of the present invention may further include a resin member that covers the surface acoustic wave filter, which is disposed on the module substrate, and a wiring pattern that is connected to the electrode pattern and that is provided in or on the resin member, and the electrode pattern and the wiring pattern may be inductively coupled or capacitively coupled to each other.

As a result, the electrode pattern of the surface acoustic wave filter, the electrode pattern including IDT electrodes and a wiring electrode pattern connecting the IDT electrodes, and the wiring pattern provided in or on the resin member, which is in contact with the surface acoustic wave filter, are able to be coupled to each other with a narrow gap. Thus, stronger coupling than the coupling between the electrode pattern and the internal wiring pattern of the module substrate is ensured with a small space. The attenuation outside the pass band is improved by a signal propagation path that is provided for outside the pass band provided by this strong coupling. Therefore, the high-frequency module is reduced in size while the attenuation characteristics of the surface acoustic wave filter outside the pass band are improved.

The wiring pattern may be provided in or on the resin member so as to overlap a portion of the electrode pattern when the module substrate is viewed in plan view.

As a result, the electrode pattern of the surface acoustic wave filter and the wiring pattern provided in or on the resin member are able to be coupled to each other with a narrower gap. Therefore, a reduction in the size of the high-frequency module is facilitated while the attenuation characteristics of the surface acoustic wave filter outside the pass band are further improved.

A distance between the wiring pattern and the electrode pattern may be smaller than a distance between the module substrate and the electrode pattern.

As a result, the coupling between the electrode pattern and the wiring pattern is stronger than the coupling between the electrode pattern and the wiring pattern provided in the module substrate. Therefore, strong coupling is ensured with a space smaller than that in a configuration in which the wiring pattern of the module substrate and the electrode pattern are coupled to each other.

The wiring pattern may be a shunt inductor that is connected to an input-output terminal of the surface acoustic wave filter and to a ground terminal, and the wiring pattern and the electrode pattern may be inductively coupled, capacitively coupled, or inductively and capacitively coupled to each other.

A signal propagation path that is provided by the inductive coupling, capacitive coupling, or inductive coupling and capacitive coupling and that is connected to the shunt inductor is particularly effective to increase the attenuation outside the pass band. Therefore, the attenuation characteristics of the surface acoustic wave filter outside the pass band are improved.

The electrode pattern and the wiring pattern may be connected to each other by a second internal wiring pattern of the module substrate and a first columnar conductor that extends through the resin member, and the wiring pattern and the ground terminal may be connected to each other by a second columnar conductor that extends through the resin member and by a third internal wiring pattern of the module substrate.

With the second internal wiring pattern, the third internal wiring pattern, the first columnar conductor, and the second columnar conductor, the wiring pattern is able to be disposed at any position in or on the resin member. In other words, the positional relationship between the electrode pattern and the wiring pattern is able to be improved or optimized. Therefore, the high-frequency module is able to be reduced in size while the attenuation characteristics of the surface acoustic wave filter outside the pass band are improved.

High-frequency modules according to preferred embodiments of the present invention are reduced in size while mutual interference between a surface acoustic wave filter and a peripheral wiring pattern included in the high-frequency modules is reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the drawings. Note that preferred embodiments of the present invention, which will be described below, are comprehensive or specific examples. Numerical values, shapes, materials, components, arrangements and connection configurations of the components, and other aspects that are described in the following preferred embodiments are examples and are not intended to limit the scope of the present invention. Among the components according to the following preferred embodiments, the components that are not described in the independent claim will be described as arbitrary components. In addition, the sizes of the components illustrated in the drawings or the ratio of their sizes are not necessarily exact.

First Preferred Embodiment

Figure 1:
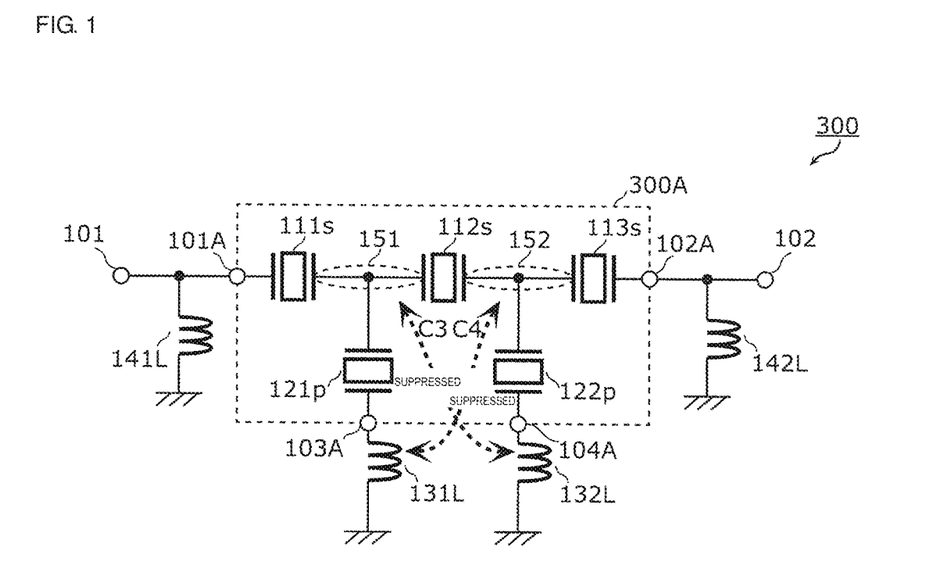
FIG. 1 is a circuit configuration diagram of a high-frequency module according to a first preferred embodiment of the present invention.

FIG. 1 is a circuit configuration diagram of a high-frequency module 300 according to a first preferred embodiment of the present invention. The high-frequency module 300 illustrated in FIG. 1 includes a surface acoustic wave (hereinafter referred to as SAW) filter 300A, inductors 131L, 132L, 141L, and 142L, which are connected to the SAW filter 300A, an input terminal 101, and an output terminal 102.

The SAW filter 300A is a ladder band pass filter and includes serial resonators 111s, 112s, and 113s, and parallel resonators 121p and 122p. The serial resonators 111s to 113s are connected in series to each other between a filter input terminal 101A and a filter output terminal 102A. The parallel resonators 121p and 122p are connected in parallel to each other between connection points of the serial resonators 111s to 113s and filter reference terminals 103A and 104A.

The inductor 131L is connected between the filter reference terminal 103A and a ground terminal, and the inductor 132L is connected between the filter reference terminal 104A and a ground terminal. Each of the inductors 131L and 132L generates an attenuation pole outside a pass band of the SAW filter 300A by defining an LC resonance circuit with a capacitance component of the SAW filter 300A.

The inductor 141L is connected between a wiring line connecting the input terminal 101 and the filter input terminal 101A to each other and the ground, and the inductor 142L is connected between a wiring line connecting the output terminal 10 and the filter output terminal 102A to each other and the ground. The inductor 141L matches the impedance of a peripheral circuit (e.g., an antenna circuit) that is connected to the input terminal 101 to that of the SAW filter 300A, and the inductor 142L matches the impedance of a circuit (e.g., an amplifier circuit) that is connected to the output terminal 102 to that of the SAW filter 300A.

Note that the SAW filter 300A does not need to have a ladder structure and may have a different structure, such as a longitudinally-coupled structure, as long as a resonator is included therein. In addition, the connection configurations of the inductors and a capacitor, which are connected to the SAW filter 300A, are not limited to the above-described configurations.

Figure 2:
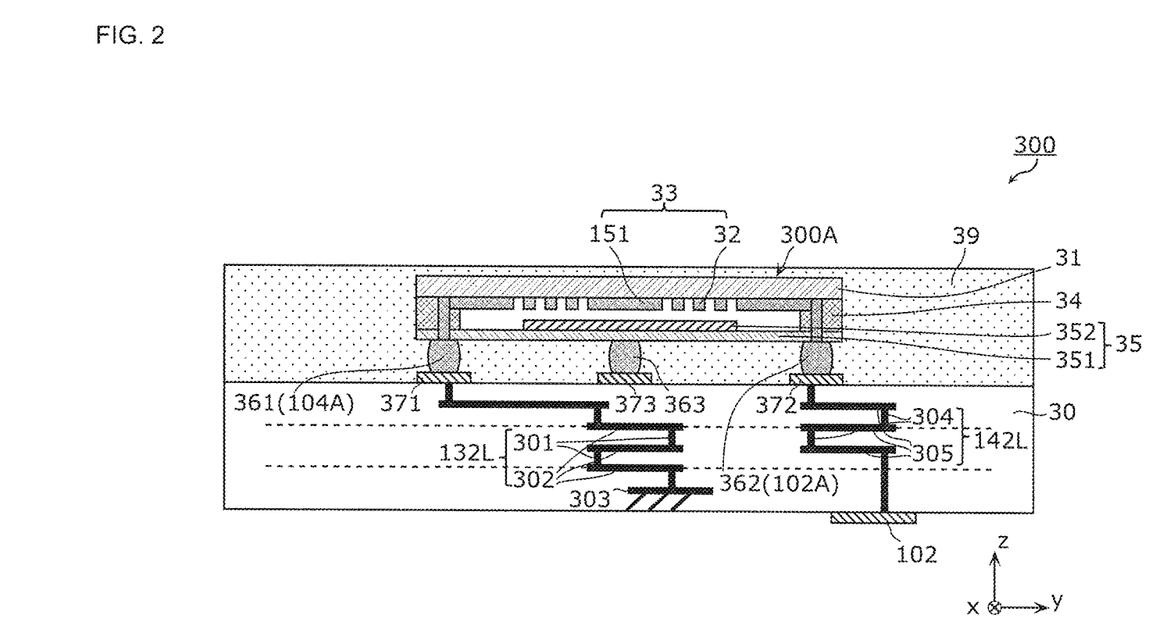
FIG. 2 is a diagram illustrating a sectional structure of the high-frequency module according to the first preferred embodiment of the present invention.

FIG. 2 is a diagram illustrating a sectional structure of the high-frequency module 300 according to the first preferred embodiment. As illustrated in FIG. 2, the high-frequency module 300 includes a module substrate 30 and the SAW filter 300A.

The SAW filter 300A includes a piezoelectric substrate and an electrode pattern 33 provided on the piezoelectric substrate 31. The electrode pattern 33 includes comb-shaped IDT electrodes 32 and a connection wiring line 151 connecting the IDT electrodes 32. The resonators illustrated in FIG. 1 include the IDT electrodes 32 and the piezoelectric substrate 31.

The SAW filter 300A according to the present preferred embodiment preferably has a WLP structure and includes the piezoelectric substrate 31, the electrode pattern 33, a support 34 that is provided on a surface of the piezoelectric substrate 31 so as to surround the electrode pattern 33, and a cover 351 that is provided on the support 34 and covers the electrode pattern 33 so as to define a hollow space together with the support 34 and the piezoelectric substrate 31. A shield electrode 352 that is grounded is provided on a surface (rear surface) of the cover 351, the surface facing the piezoelectric substrate 31. The cover 351 and the shield electrode 352 define a cover 35. For example, the cover 351 is preferably made of a polyimide film having a thickness of about 45 μm or is made of a material including at least one of an epoxy, urethane, phenol, a polyester, BCB, and PBO. For example, the shield electrode 352 is preferably made of a conductive metal material such as copper, aluminum, silver, or gold and provided on the front surface or the rear surface of the cover 351 by, for example, evaporation or printing.

With the above-described configuration, in the high-frequency module 300, the module substrate 30, the cover 351, and the piezoelectric substrate 31 are disposed in this order in a perpendicular or substantially perpendicular direction with respect to the module substrate 30 (in the z-axis direction).

With the above-described configuration, the shield electrode 352 is disposed between the electrode pattern 33 of the WLP SAW filter 300A and an internal wiring pattern provided in the module substrate 30, and thus, undesirable mutual interference between the SAW filter 300A and the internal wiring pattern is reduced or prevented. In addition, it is not necessary to provide the shield electrode 352 to suppress the mutual interference in or on the module substrate 30, and thus, the area of the module substrate 30 is reduced. Therefore, the high-frequency module 300 is able to be reduced in size.

The module substrate 30 is preferably a multilayer substrate including a plurality of layers laminated together, and examples of the multilayer substrate include a ceramic multilayer substrate and a PCB. A surface electrode 371 that is connected to a bump 361, which defines and functions as the filter reference terminal 104A of the SAW filter 300A, a surface electrode 372 that is connected to a bump 362, which defines and functions as the filter output terminal 102A of the SAW filter 300A, and a surface electrode 373 that is connected to a bump 363, which defines and functions as another filter reference terminal (not illustrated) of the SAW filter 300A, are provided on a surface of the module substrate 30.

The surface electrode 371 is connected to a ground electrode 303 by via conductors 301 and internal wiring patterns 302 that are provided in the module substrate 30. The via conductors 301 and the internal wiring patterns 302 define a first internal wiring pattern, which defines and functions as a multilayer coil, and correspond to the inductor 132L illustrated in FIG. 1. In other words, the first internal wiring pattern is extended from the electrode pattern 33 and is the inductor 132L that is connected to the parallel resonator 122p of the SAW filter 300A and to the ground terminal.

The input terminal 101 (not illustrated) and the output terminal 102 are provided in or on the rear surface of the module substrate 30. The output terminal 102 is connected to the surface electrode 372 by via conductors 304 and internal wiring patterns 305. The via conductors 304 and the internal wiring patterns 305 define a multilayer coil and correspond to the inductor 142L illustrated in FIG. 1.

A resin member 39 coats the SAW filter 300A that is disposed on the module substrate 30. An example of the material of the resin member 39 is a resin such, as a thermosetting epoxy resin. Note that the epoxy resin may include an inorganic filler such as $SiO_2$.

Figure 3:
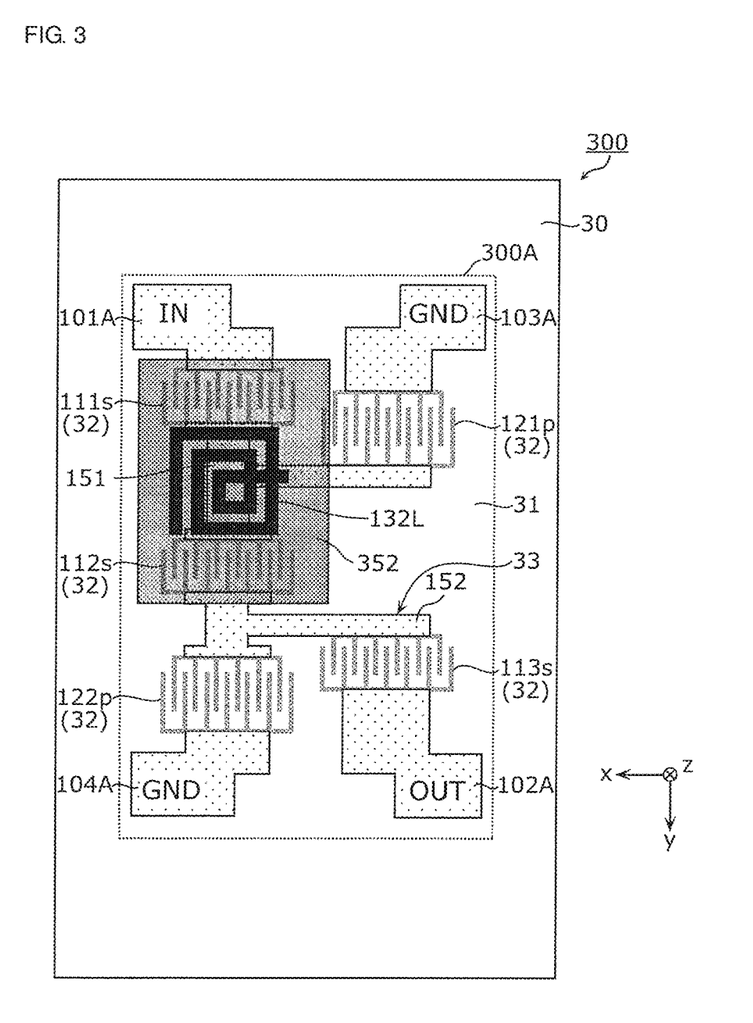
FIG. 3 is a plan view illustrating the high-frequency module according to the first preferred embodiment of the present invention in a see-through manner.

FIG. 3 is a plan view illustrating the high-frequency module 300 according to the first preferred embodiment in a see-through manner. FIG. 3 is a perspective view of the high-frequency module 300 when viewed from the bottom surface of the module substrate 30 (when viewed in the negative z-axis direction). More specifically, in FIG. 3, the module substrate 30 is illustrated in a see-through manner in order to illustrate the first internal wiring pattern (inductor 132L), and the cover 35 is illustrated in a see-through manner in order to illustrate the shield electrode 352 and the electrode pattern 33.

In the SAW filter 300A, the electrode pattern 33, such as that illustrated in FIG. 3, is provided on the surface (a main surface on the negative-z-axis-direction side) of the piezoelectric substrate 31. The electrode pattern 33 includes the IDT electrodes 32 that correspond to the serial resonators 111s, 112s, and 113s and to the parallel resonators 121p and 122p, the connection wiring line 151 that connects the serial resonators 111s and 112s to each other, and a connection wiring line 152 that connects the serial resonators 112s and 113s to each other. Each component of the electrode pattern 33 may have an inductance component or a capacitance component as a result of a high-frequency current flowing therethrough. For example, the IDT electrodes 32 primarily provide a capacitance component, and the connection wiring lines 151 and 152 primarily provide an inductance component.

Here, when the module substrate 30 is viewed in plan view, the shield electrode 352 overlaps the connection wiring line 151, which is a portion of the electrode pattern 33.

As described above, the inductor 132L defines an LC resonance circuit together with the capacitance component of the SAW filter 300A, so that an attenuation pole is generated outside the pass band of the SAW filter 300A. In addition, if the inductor 132L is inductively coupled, capacitively coupled, or inductively and capacitively coupled to the connection wiring line 151, this may cause an adverse effect, such as a decrease in the attenuation of an attenuation pole generated in a predetermined frequency range outside the pass band or a shift of the attenuation pole.

In contrast, in the high-frequency module 300 according to the present preferred embodiment, since the shield electrode 352 and the connection wiring line 151 overlap each other when the module substrate 30 is viewed in plan view, at least one of inductive coupling (C3 in FIG. 1) and capacitive coupling between the connection wiring line 151 and the first internal wiring pattern (inductor 132L) provided in the module substrate 30 is able to be reduced or prevented. Therefore, undesirable mutual interference between the electrode pattern 33 and the internal wiring patterns of the module substrate 30 is more effectively reduced or prevented, and degradation of the characteristics of the SAW filter 300A is reduced or prevented.

In addition, in the present preferred embodiment, as illustrated in FIG. 3, the shield electrode 352 is structured such that the shield electrode 352 overlaps a region in which the first internal wiring pattern (inductor 132L) and the electrode pattern 33 overlap each other (a region in which the inductor 132L and the connection wiring line 151 overlap each other) when the module substrate 30 is viewed in plan view.

As a result, the shield electrode 352 is disposed in the region in which the electrode pattern 33 and the first internal wiring pattern overlap each other when viewed in plan view, and thus, undesirable mutual interference between the electrode pattern 33 and the first internal wiring pattern is able to reduced or prevented with high precision.

Note that a combination of the components between which at least one of inductive coupling and capacitive coupling is reduced or prevented may preferably be a combination of the inductor 131L and the connection wiring line 152 (C4 in FIG. 1) as well as or instead of a combination of the inductor 132L and the connection wiring line 151.

In addition, the coupling between the first internal wiring pattern and the electrode pattern 33 that is reduced or prevented is not limited to inductive coupling and may be capacitive coupling. Accordingly, the combination in which the coupling is reduced or prevented may be, for example, a combination of the first internal wiring pattern and the IDT electrodes 32. Furthermore, a portion of the electrode pattern 33 that is reduced or prevented from being coupled to the first internal wiring pattern may be a portion in which the IDT electrodes 32 and the connection wiring line are combined together.

Note that the shield electrode 352 may be provided on a portion of the surface (rear surface) of the cover 351 that faces the piezoelectric substrate 31 or may be provided on the entire or substantially the entire rear surface. Alternatively, the shield electrode 352 may be provided on a portion of the surface (front surface) of the cover 351 that faces the module substrate 30 or may be provided on the entire or substantially the entire front surface.

Note that, in the present preferred embodiment, although the configuration has been described as an example in which the shield electrode 352 is provided in order to reduce or prevent coupling between the components that are disposed between the input and output terminals connected to the one SAW filter 300A, preferred embodiments of the present invention are not limited to this configuration. The high-frequency module according to a preferred embodiment of the present invention may include a plurality of SAW filters, representative examples of which are a duplexer and a dual filter. In this case, for example, a shield electrode is disposed so as to eliminate coupling between an electrode pattern of one of the SAW filters and a first internal wiring pattern (inductor) that is connected to another of the SAW filters, so that the isolation between the plurality of filters is improved.

Second Preferred Embodiment

The high-frequency module according to the first preferred embodiment has a configuration in which coupling between the electrode pattern of the SAW filter and the wiring patterns is eliminated. In contrast, a high-frequency module according to a second preferred embodiment of the present invention has the configuration according to the first preferred embodiment and a configuration in which an electrode pattern of a SAW filter and a wiring pattern are actively coupled to each other. Description of a configuration of the high-frequency module according to the second preferred embodiment that is the same or substantially the same as that of the high-frequency module according to the first preferred embodiment will be omitted, and the differences between the high-frequency module according to the second preferred embodiment and the high-frequency module according to the first preferred embodiment will be primarily described below.

Figure 4:
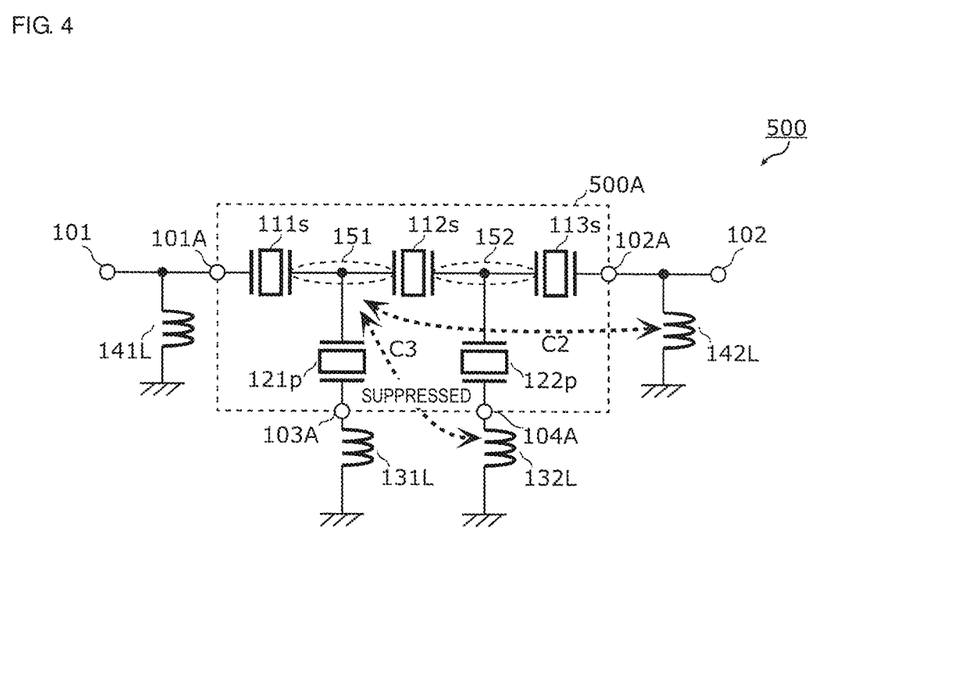
FIG. 4 is a circuit configuration diagram of a high-frequency module according to a second preferred embodiment of the present invention.

FIG. 4 is a circuit configuration diagram of a high-frequency module 500 according to the second preferred embodiment. The high-frequency module 500 illustrated in FIG. 4 includes a SAW filter 500A, the inductors 131L, 132L, 141L, and 142L, which are connected to the SAW filter 500A, the input terminal 101, and the output terminal 102.

Figure 5:
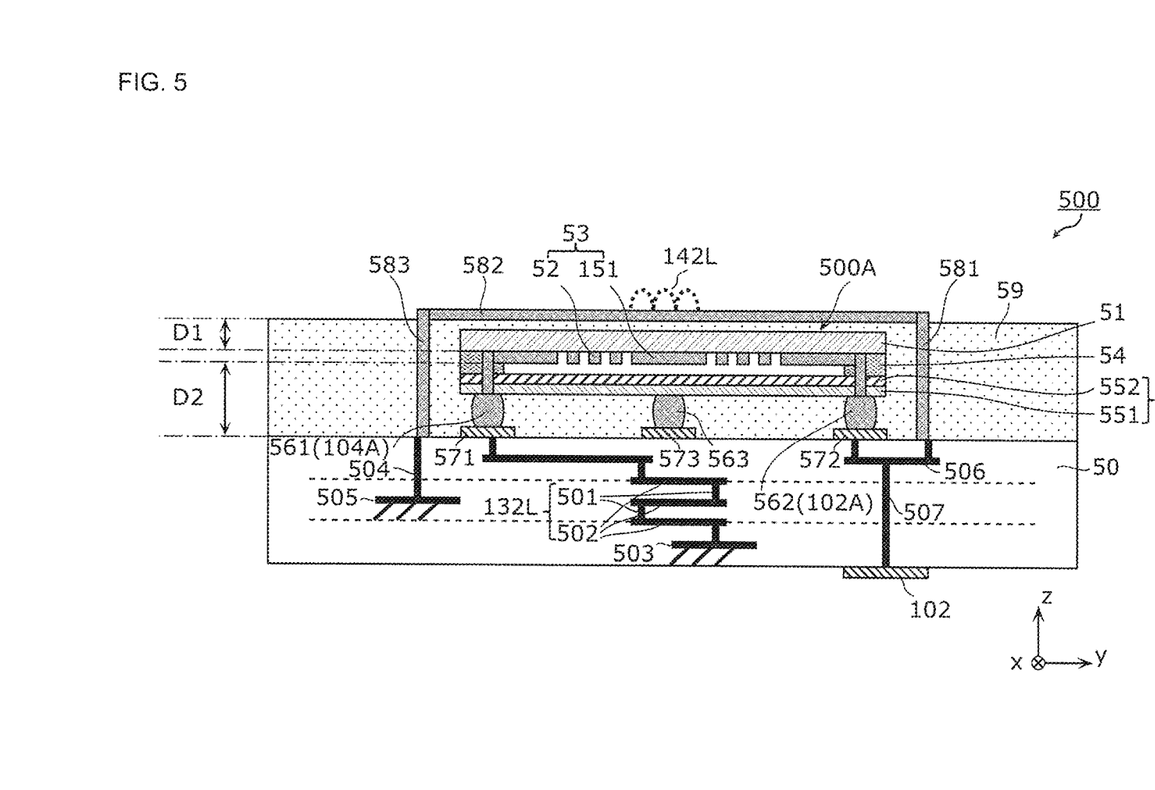
FIG. 5 is a diagram illustrating a sectional structure of the high-frequency module according to the second preferred embodiment of the present invention.

FIG. 5 is a diagram illustrating a sectional structure of the high-frequency module 500 according to the second preferred embodiment. As illustrated in FIG. 5, the high-frequency module 500 includes a module substrate 50, the SAW filter 500A, a resin member 59, and a wiring pattern 582.

The SAW filter 500A includes a piezoelectric substrate and an electrode pattern 53 that is provided on the piezoelectric substrate 51. The electrode pattern 53 includes comb-shaped IDT electrodes 52 and the connection wiring line 151 connecting the IDT electrodes 52. The resonators illustrated in FIG. 4 are defined by the IDT electrodes 52 and the piezoelectric substrate 51.

The SAW filter 500A according to the present preferred embodiment preferably has a WLP structure and includes the piezoelectric substrate 51, the electrode pattern 53, a support 54, and a cover 551. A shield electrode 552 that is grounded is provided on a surface (rear surface) of the cover 551, the surface facing the piezoelectric substrate 51. The cover 551 and the shield electrode 552 define a cover 55. With this configuration, in the high-frequency module 500, the module substrate 50, the cover 551, the piezoelectric substrate 51, and the wiring pattern 582 are disposed in this order in a perpendicular or substantially perpendicular direction with respect to the module substrate 50 (in the z-axis direction).

With the above-described configuration, the shield electrode 552 is disposed between the electrode pattern 53 of the WLP SAW filter 500A and an internal wiring pattern provided in the module substrate 50, and thus, undesirable mutual interference between the SAW filter 500A and the internal wiring pattern is reduced or prevented. In addition, it is not necessary to provide the shield electrode 552 to reduce or prevent the mutual interference in or on the module substrate 50, and thus, the area of the module substrate 50 is reduced. Therefore, the high-frequency module 500 is reduced in size.

The module substrate 50 is preferably a multilayer substrate including a plurality of layers laminated together, and examples of the multilayer substrate include a ceramic multilayer substrate and a PCB. A surface electrode 571 that is connected to a bump 561, which defines and functions as the filter reference terminal 104A of the SAW filter 500A, a surface electrode 572 that is connected to a bump 562, which defines and functions as the filter output terminal 102A of the SAW filter 500A, and a surface electrode 573 that is connected to a bump 563, which defines and functions as another filter reference terminal (not illustrated) of the SAW filter 500A, are provided on a surface of the module substrate 50.

The surface electrode 571 is connected to a ground electrode 503 by via conductors 501 and internal wiring patterns 502 that are provided in the module substrate 50. The via conductors 501 and the internal wiring patterns 502 define the first internal wiring pattern, which defines and functions as a multilayer coil, and correspond to the inductor 132L illustrated in FIG. 4. In other words, the first internal wiring pattern is connected to the electrode pattern 53 and is the inductor 132L that is connected to the parallel resonator 122p of the SAW filter 500A and to the ground terminal.

The input terminal 101 (not illustrated) and the output terminal 102 are provided in or on the rear surface of the module substrate 50. The output terminal 102 is connected to the surface electrode 572 by a via conductor 507 and an internal wiring pattern 506.

The resin member 59 coats the SAW filter 500A that is disposed on the module substrate 50.

The wiring pattern 582 is connected to the electrode pattern 53 and provided on a surface of the resin member 59. More specifically, the wiring pattern 582 is connected to the electrode pattern 53 by a columnar conductor 581, the internal wiring pattern 506 (second internal wiring pattern), the surface electrode 572, and a bump 562. In addition, the wiring pattern 582 is connected to a ground electrode 505 by a columnar conductor 583 and a via conductor 504 (third internal wiring pattern) of the module substrate 50. The columnar conductors 581 and 583 are each preferably, for example, a Cu pillar.

Here, the wiring pattern 582 has an inductance component and defines, for example, the inductor 142L illustrated in FIG. 4. In other words, the wiring pattern 582 is the shunt inductor 142L that is connected to the output terminal 102 of the SAW filter 500A and to the ground terminal.

Note that the wiring pattern 582 does not need to be provided on the surface of the resin member 59 and may be provided in the resin member 59.

As illustrated in FIG. 5, a distance D1 between the wiring pattern 582 and the electrode pattern 53 is preferably smaller than a distance D2 between the module substrate 50 and the electrode pattern 53.

In addition, the wiring pattern 582 overlaps the SAW filter 500A when the module substrate 50 is viewed in plan view. More specifically, the wiring pattern 582 is provided in or on the resin member 59 so as to overlap a portion of the electrode pattern 53. Here, the wiring pattern 582 may preferably include a meandering portion (a portion having a folded shape), for example. This meandering portion defines and functions as an inductor as a result of a high-frequency current flowing through the wiring pattern 582. The meandering portion corresponds to the inductor 142L illustrated in FIG. 4.

In the present preferred embodiment, the meandering portion of the wiring pattern 582 and the connection wiring line 151 of the electrode pattern 53 overlap each other when viewed from the top surface of the resin member 59 (when viewed in the positive z-axis direction).

With the above-described configuration, inductive coupling (C2 in FIG. 4), capacitive coupling, or inductive coupling and capacitive coupling between the meandering portion of the wiring pattern 582 and the connection wiring line 151 occurs with a narrow gap defined by only the resin member 59.

As a result, strong coupling is ensured with a space smaller than that in the case in which the electrode pattern 53 and the internal wiring pattern of the module substrate 50 are coupled to each other. The attenuation outside the pass band of the SAW filter 500A is improved by a signal propagation path that is provided outside the pass band by this strong coupling. Therefore, the high-frequency module is reduced in size while the attenuation characteristics of the surface acoustic wave filter outside the pass band are improved.

In addition, the shield electrode 552 overlaps the connection wiring line 151, which is a portion of the electrode pattern 53, when the module substrate 50 is viewed in plan view.

The first internal wiring pattern (inductor 132L) defines an LC resonance circuit together with a capacitance component of the SAW filter 500A, so that an attenuation pole is generated outside the pass band of the SAW filter 500A. In addition, if the inductor 132L is inductively coupled, capacitively coupled, or inductively and capacitively coupled to the connection wiring line 151, this may cause an adverse effect, such as a decrease in the attenuation of an attenuation pole generated in a predetermined frequency range outside the pass band or a shift of the attenuation pole.

In contrast, in the high-frequency module 500 according to the present preferred embodiment, the shield electrode 552 and the connection wiring line 151 overlap each other when the module substrate 50 is viewed in plan view, and thus, at least one of inductive coupling (C3 in FIG. 4) and capacitive coupling between the connection wiring line 151 and the first internal wiring pattern (inductor 132L) is reduced or prevented. Therefore, undesirable mutual interference between the electrode pattern 53 and the internal wiring patterns of the module substrate 50 is more effectively reduced or prevented, and degradation of the characteristics of the SAW filter 500A is reduced or prevented.

In addition, in the present preferred embodiment, the shield electrode 552 is structured such that the shield electrode 552 overlaps the region in which the first internal wiring pattern (inductor 132L) and the electrode pattern 53 overlap each other (the region in which the inductor 132L and the connection wiring line 151 overlap each other) when the module substrate 50 is viewed in plan view.

As a result, the shield electrode 552 is disposed in the region in which the electrode pattern 53 and the first internal wiring pattern overlap each other when viewed in plan view, and thus, undesirable mutual interference between the electrode pattern 53 and the first internal wiring pattern is reduced or prevented with high precision.

Note that a combination of the components between which at least one of inductive coupling and capacitive coupling is provided may be a combination of the meandering portion of the wiring pattern 582 and the connection wiring line 152 as well as a combination of the meandering portion of the wiring pattern 582 and the connection wiring line 151.

In addition, a combination of the components between which at least one of inductive coupling and capacitive coupling is reduced or prevented may be a combination of the inductor 131L and the connection wiring line 152 as well as a combination of the inductor 132L and the connection wiring line 151.

It is preferable that the direction in which current flows through the wiring pattern 582 be the same as the direction in which current flows through a portion of the electrode pattern that overlaps with the wiring pattern 582. As a result, coupling between a magnetic field generated by the wiring pattern 582 and a magnetic field generated by the portion of the electrode pattern 53 is improved. Therefore, the attenuation characteristics of the SAW filter 500A outside the pass band are further improved.

The coupling between the wiring pattern 582 and the electrode pattern 53 is not limited to inductive coupling and may be capacitive coupling. Accordingly, the combination in which the coupling occurs may be, for example, a combination of the wiring pattern 582 and the IDT electrodes 52.

In addition, the coupling between the first internal wiring pattern and the electrode pattern 53 that is reduced or prevented is not limited to inductive coupling and may be capacitive coupling. Accordingly, the combination in which the coupling is reduced or prevented may be, for example, a combination of the first internal wiring pattern and the IDT electrodes 52.

Note that the shield electrode 552 may be provided on the entire or substantially the entire surface (rear surface) of the cover 551 that faces the piezoelectric substrate 51 or may be provided on a portion of the rear surface. Alternatively, the shield electrode 552 may be provided on the entire or substantially the entire surface (front surface) of the cover 551 that faces the module substrate 50 or may be provided on a portion of the front surface.

Although the high-frequency modules according to the first and second preferred embodiments of the present invention have been described above, the high-frequency module according to the present invention is not limited to the above-described preferred embodiments. Other preferred embodiments obtained by combining arbitrary components included in the above-described preferred embodiments, modifications obtained by making various modifications, within the gist of the present invention, devised by those skilled in the art to the above-described preferred embodiments, and various devices each including the high-frequency module according to preferred embodiments of the present disclosure provided therein are also included in the scope of the present invention.

In addition, in the high-frequency modules according to the above-described preferred embodiments, other high-frequency circuit elements, wiring lines, and other components may be inserted between paths connecting the circuit elements and the signal paths illustrated in the drawings.

Preferred embodiments of the present invention may be widely used as a power amplification module that is disposed in a multi-band/multi-mode-capable front-end section in a communication device, such as a cellular phone, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising:
   a module substrate that includes an internal wiring pattern;
   a surface acoustic wave filter that is disposed on the module substrate; and
   a resin member that covers the surface acoustic wave filter; wherein
   the surface acoustic wave filter includes:
      a piezoelectric substrate;
      an electrode pattern that is provided on the piezoelectric substrate;
      a support that is provided on a surface of the piezoelectric substrate so as to surround the electrode pattern; and
      a cover that is provided on the support and that covers the electrode pattern so as to define a hollow space together with the support and the piezoelectric substrate;
   the module substrate, the cover, and the piezoelectric substrate are disposed in this order in a perpendicular or substantially perpendicular direction with respect to the module substrate;
   a shield electrode that is grounded is provided in or on a surface of the cover that faces the module substrate or is provided in or on a surface of the cover that faces the piezoelectric substrate;
   a wiring pattern is connected to the electrode pattern and is provided in or on the resin member; and
   the electrode pattern and the wiring pattern are inductively coupled or capacitively coupled to each other.

2. The high-frequency module according to claim 1, wherein the shield electrode overlaps at least a portion of the electrode pattern when the module substrate is viewed in a plan view.

3. The high-frequency module according to claim 1, wherein the shield electrode overlaps a region in which a first internal wiring pattern of the module substrate and the electrode pattern overlap each other when the module substrate is viewed in a plan view.

4. The high-frequency module according to claim 3, wherein
   the first internal wiring pattern is connected to the electrode pattern and is an inductor that is connected to a parallel resonator of the surface acoustic wave filter and to a ground terminal; and the shield electrode reduces or prevents inductive coupling, capacitive coupling, or inductive coupling and capacitive coupling between the first internal wiring pattern and the electrode pattern.

5. The high-frequency module according to claim 1, wherein a direction in which a current flows through the wiring pattern is the same or substantially the same as a direction in which a current flows through the portion of the electrode pattern that overlaps with the wiring pattern.

6. The high-frequency module according to claim 1, wherein the wiring pattern is provided in or on the resin member so as to overlap a portion of the electrode pattern when the module substrate is viewed in plan view.

7. The high-frequency module according to claim 1, wherein a distance between the wiring pattern and the electrode pattern is smaller than a distance between the module substrate and the electrode pattern.

8. The high-frequency module according to claim 1, wherein
the wiring pattern includes a shunt inductor that is connected to an input-output terminal of the surface acoustic wave filter and to a ground terminal; and
the wiring pattern and the electrode pattern are inductively coupled, capacitively coupled, or inductively and capacitively coupled to each other.

9. The high-frequency module according to claim 8, wherein
the electrode pattern and the wiring pattern are connected to each other by a second internal wiring pattern of the module substrate and a first columnar conductor that extends through the resin member; and
the wiring pattern and the ground terminal are connected to each other by a second columnar conductor that extends through the resin member and by a third internal wiring pattern of the module substrate.

10. The high-frequency module according to claim 9, wherein the first and second columnar conductors are Cu pillars.

11. The high-frequency module according to claim 1, wherein the surface acoustic wave filter has a wafer level package structure.

12. The high-frequency module according to claim 1, wherein the module substrate is a multilayer substrate including a plurality of layers laminated therein.

13. The high-frequency module according to claim 12, wherein the multilayer substrate is a ceramic multilayer substrate.

14. The high-frequency module according to claim 1, wherein the resin member is made of thermosetting epoxy resin.

15. The high-frequency module according to claim 1, wherein
the surface acoustic wave filter is a ladder band pass filter that includes series resonators and parallel resonators;
the series resonators are connected in series to each other between an input terminal and an output terminal of the surface acoustic wave filter; and
the parallel resonators are connected in parallel to each other between respective connection points of the series resonators and filter ground terminals of the surface acoustic wave filter.

16. The high-frequency module according to claim 1, wherein the internal wiring pattern includes a meandering-shaped portion.

\* \* \* \* \*